(12) United States Patent
Lin

(10) Patent No.: US 7,545,295 B2
(45) Date of Patent: Jun. 9, 2009

(54) SELF-CALIBRATING DIGITAL-TO-ANALOG CONVERTER AND METHOD THEREOF

(75) Inventor: Chia-Liang Lin, Fremont, CA (US)

(73) Assignee: Realtek Semiconductor Corp., Hsinchu (TW)

( * ) Notice: Subject to any disclaimer, the term of this patent is extended or adjusted under 35 U.S.C. 154(b) by 0 days.

(21) Appl. No.: 12/018,999

(22) Filed: Jan. 24, 2008

(65) Prior Publication Data

US 2009/0073012 A1 Mar. 19, 2009

Related U.S. Application Data

(60) Provisional application No. 60/972,256, filed on Sep. 14, 2007.

(51) Int. Cl.
*H03M 1/10* (2006.01)

(52) U.S. Cl. .......... 341/120; 341/136; 341/144

(58) Field of Classification Search ........... 341/120, 341/144
See application file for complete search history.

(56) References Cited

U.S. PATENT DOCUMENTS

| | | | |
|---|---|---|---|
| 4,441,136 A | 4/1984 | Hampshire | |
| 5,148,169 A | 9/1992 | Bustance et al. | |
| 5,187,482 A | 2/1993 | Tiemann et al. | |
| 5,404,142 A | 4/1995 | Adams et al. | |
| 5,684,482 A | 11/1997 | Galton | |
| 5,870,044 A * | 2/1999 | Dell'ova et al. | 341/120 |
| 5,949,362 A | 9/1999 | Tesch et al. | |
| 5,977,899 A | 11/1999 | Adams | |
| 6,130,632 A * | 10/2000 | Opris | 341/120 |
| 6,304,608 B1 | 10/2001 | Chen et al. | |
| 6,331,830 B1 * | 12/2001 | Song et al. | 341/121 |
| 6,501,402 B2 * | 12/2002 | Boxho | 341/120 |
| 6,697,004 B1 | 2/2004 | Galton et al. | |
| 6,897,797 B2 | 5/2005 | Zhao et al. | |
| 6,906,652 B2 * | 6/2005 | Bugeja | 341/145 |
| 6,961,013 B2 | 11/2005 | Lin et al. | |
| 7,330,060 B2 | 2/2008 | Abel et al. | |
| 7,466,252 B1 * | 12/2008 | Radulov et al. | 341/120 |

* cited by examiner

*Primary Examiner*—Khai M Nguyen
(74) *Attorney, Agent, or Firm*—Knobbe, Martens, Olson & Bear LLP

(57) ABSTRACT

A digital-to-analog converter improves differential non-linearity by performing a calibration of at least one weighted cell in response to a calibration command. The digital-to-analog converter includes a group of weighted cells, a tunable cell having a tunable weight controlled by a tuning word, and a calibration cell to generate a combined output signal in response to a digital input word, the calibration command, and a calibration sequence. The digital-to-analog converter also includes a calibration circuit configured to sample and subsequently process the combined output signal to establish the tuning word in accordance with the calibration command and the calibration sequence.

19 Claims, 3 Drawing Sheets

SELF-CALIBRATING DIGITAL-TO-ANALOG CONVERTER AND METHOD THEREOF

The present application claims priority benefits under 35 U.S.C. § 119(e) from U.S. Provisional Application No. 60/972,256, filed on Sep. 14, 2007, entitled "Self-Calibrating Digital-to-Analog Converter and Method Thereof," which is hereby incorporated herein in its entirety by reference.

BACKGROUND OF THE INVENTION

1. Field of the Invention

The present invention relates to digital-to-analog converters and in particular to digital-to-analog converters that perform self-calibration.

2. Description of the Related Art

A digital-to-analog converter (DAC) is used to convert a digital control word into an analog signal. There are numerous forms of DACs. While the principle disclosed in the present invention is applicable to any form of DACs, a current-steering DAC is used as an example throughout this disclosure.

FIG. 1 depicts a typical 4-bit current-steering DAC 100 that converts a 4-bit control code D[3:0] into an analog current signal IOUT. The DAC 100 comprises four current cells I0, I1 I2, and I3, controlled by digital bits D[0], D[1], D[2], and D[3], respectively. Each of the four current cells is tied to a first fixed potential node VSRC on one end and tied to a second potential node VOUT on the other end. Each current cell is turned on when its corresponding controlling bit is asserted, and turned off otherwise.

The current cell I0 is referred to as a least significant bit (LSB) cell that is configured to generate a current output of $I_{LSB}$, while the current cell I3 is referred to as a most significant bit (MSB) cell. In an ideal situation, the current cells I0, I1, I2, and I3 generate current outputs of $2^0 \cdot I_{LSB}$, $2^1 \cdot I_{LSB}$, $2^2 \cdot I_{LSB}$, and $2^3 \cdot I_{LSB}$, respectively, when their controlling bits D[0], D[1], D[2], and D[3] are asserted, respectively. A total output current of the DAC 100 (or the analog current signal IOUT) has the following relationship:

$$IOUT = D[0] \cdot 2^0 \cdot I_{LSB} + D[1] \cdot 2^1 \cdot I_{LSB} + D[2] \cdot 2^2 \cdot I_{LSB} + D[3] \cdot 2^3 \cdot I_{LSB}; \text{ or}$$

$$IOUT = (D[0] \cdot 2^0 + D[1] \cdot 2^1 + D[2] \cdot 2^2 + D[3] \cdot 2^3) \cdot I_{LSB}.$$

Thus, the analog current signal IOUT is linearly proportional to the number represented by the control code D[3:0]. In practice, a manufacturing process cannot guarantee a perfectly accurate output level for each of the current cells. This effectively introduces an error to the total output current of the DAC 100. A particular specification of interest regarding a DAC's accuracy is differential non-linearity (DNL). Ideally, the DAC's total output current will have an incremental change of $I_{LSB}$ in response to an incremental change in the number represented by the control code D[3:0]. DNL is defined as a difference between an actual incremental change and the ideal incremental change for the total output current. The worse case DNL usually occurs when the control code D[3:0] makes an incremental change from code 7 (D[3:0]=0111 with all current cells turned on except for the MSB cell) to code 8 (D[3:0]=1000 with all current cells turned off except for the MSB cell). What is needed is a method to improve the DNL by calibrating the DAC to reduce the error associated with inaccuracies in the current cells.

SUMMARY OF THE INVENTION

The present invention solves these and other problems by providing a method and an apparatus for a DAC to calibrate itself. In one embodiment, an apparatus (e.g., a DAC circuit) uses a group of weighted cells, a tunable cell of a tunable weight controlled (or adjustable) by a tuning word, and a calibration cell to generate a combined output signal (e.g., an analog output) in response to a digital input word, a calibration-enabling signal, and a calibration sequence. For example, the calibration-enabling signal and the calibration sequence are logical signals. When the calibration-enabling signal is not asserted, the DAC circuit works in a normal mode in which the calibration cell is turned off while the group of weighted cells and the tunable cell are enabled (or activated) to generate the analog output in response to the digital input word (e.g., a control code). In one implementation, the tunable cell and the weighted cells turn on when respective bits of the digital input word have a first logic level (e.g., logic high or logic 1) while the calibration-enabling signal is not asserted. The tunable cell and the weighted cells turn off when the respective bits of the digital input word have a second logic level (e.g., logic low or logic 0) while the calibration-enabling signal is not asserted.

In one embodiment, the group of weighted cells and the tunable cell belong to a collection of cells in which the tunable cell is a more significant cell and the group of weighted cells is a plurality of less significant cells. When the calibration-enabling signal is asserted, the DAC circuit works in a calibration mode to adjust the tunable weight (or level) of the tunable cell. During the calibration mode, the group of weighted cells, the tunable cell, and the calibration cell are enabled to generate the analog output in response to the calibration sequence. In one embodiment, the calibration sequence is an alternating binary sequence. The calibration cell and the group of weighted cells are turned on while the tunable cell is turned off when the calibration-enabling signal is asserted and the calibration sequence has a first logic level. The calibration cell and the group of weighted cells are turned off while the tunable cell is turned on when the calibration-enabling signal is asserted and the calibration sequence has a second logic level.

In one embodiment, the DAC circuit further comprises a calibration circuit that is enabled during the calibration mode to sample the analog output at least twice and to subsequently process the samples to establish or to update the tuning word (e.g., a digital word) for the tunable cell in accordance with the calibration-enabling signal and the calibration sequence. For example, the calibration circuit is activated when the calibration-enabling signal is asserted and takes a sample of the analog output each time the calibration sequence changes states (or logic levels) for subsequent processing. The calibration circuit is deactivated during the normal mode (e.g., when the calibration-enabling signal is not asserted).

In one embodiment, the calibration circuit includes a modulator circuit, a filter circuit, and an analog-to-digital converter (ADC). The modulator circuit includes a sampling capacitor and a plurality of switches operated in accordance with a two-phase clocking scheme to periodically sample the analog output and to transfer resultant samples to an input of the filter circuit with a polarity inversion when the calibration sequence has the first logic level and without polarity inversion when the calibration sequence has the second logic level. In one implementation, the modulator samples the analog output at a substantially similar frequency as the calibration sequence and alternately modulates (or multiplies) the samples by +1 and −1. The filter circuit can be an integrator circuit that accumulates the modulated samples to effectively indicate a difference between consecutive samples. That is, an output of the filter circuit indicates a difference between an analog output generated by the tunable cell and an analog output generated by a combination of the calibration cell and the group of weighted cells. In one implementation, the ADC is used to convert the output of the filter circuit into the tuning word that adjusts the tunable cell to reduce the difference. In an ideal DAC circuit where all cells are manufactured to perfect precision, the difference would be zero. A nominal value of a weight for the tunable cell is approximately equal to a sum of nominal values of weights for the calibration cell and the weighted cells.

In one embodiment, the tunable cell includes a first sub-cell of a fixed weight and a second sub-cell of the tunable weight controllable by the tuning word. When the calibration circuit is disabled during normal operations (e.g., when the calibration-enabling signal is not asserted), the tuning word is frozen or fixed at a final value from a most recent calibration.

In one embodiment, the DAC circuit further comprises an additional tunable cell having an additional tunable weight controlled by an additional tuning word. A nominal value of a weight for the additional tunable cell is approximately equal to a sum of nominal values of weights for the calibration cell, the weighted cells, and the tunable cell. The additional tunable cell can be calibrated in a similar manner as the tunable cell with the tunable cell treated as one of the weighted cells during calibration of the additional tunable cell. The calibration circuit can sequentially calibrate the tunable cell before calibrating the additional tunable cell.

In one embodiment, a method for calibrating a DAC circuit includes incorporating a calibration cell in the DAC circuit to contribute to an analog output signal generated by a group of weighted cells. Each of the weighted cells has an on state and an off state. Similarly, the calibration cell has an on state and an off state. The method includes selecting one of the weighted cells as a subject cell for a calibration process and acquiring at least two samples of the analog output signal. For example, a first sample of the analog output signal is acquired when the calibration cell and the weighted cells not selected as the subject cell are in the off state while the subject cell is in the on state. A second sample of the analog output signal is acquired when the calibration cell and the weighted cells that carry a less weight than the subject cell are in the on state while the subject cell and the weighted cells that carry a more weight than the subject cell are in the off state.

The method then computes a difference between the first sample and the second sample. The difference is used to adapt a tuning word to adjust a weight of the subject cell. For example, the difference is filtered to generate a filtered difference that is quantized to generate the tuning word. A nominal value of the subject cell's weight is approximately equal to a sum of nominal values of the weights for the weighted cells that carry a less weight than the subject cell plus a nominal value of the calibration cell's weight. Thus, the difference between the first sample and the second sample is ideally zero. The tuning word represents an error due to, for example, manufacturing imperfection. The weight of the subject cell is adjusted by the tuning word to reduce the error.

In one embodiment, more than two samples of the analog output signal are acquired during the calibration process and the method computes the difference for each pair of samples to update the tuning word multiple times during the calibration process. In one implementation, the subject cell comprises a first sub-cell with a fixed weight and a second sub-cell with a tunable weight controlled by the tuning word. Thus, a weight of the subject cell can be adjusted multiple times during the calibration process in response to changes in the tuning word.

During the calibration process, more than one of the weighted cells can be selected for calibration. In one example implementation, the weighted cells selected for calibration are calibrated sequentially from less significant to more significant weighted cells. That is, the selected weighted cells are designated as the subject cell one by one and ordered such that the selected weighted cell carrying a less weight is calibrated before the selected weighted cell carrying a more weight.

In one embodiment, a DAC circuit that uses a group of weighted cells to generate an analog output includes means for starting a self-calibration process to tune a selected weighted cell. The DAC circuit includes means for acquiring a first output level representing a weight of the selected weighted cell and means for acquiring a second output level representing a summation of weights of a calibration cell and the weighted cells that carry a less weight than the selected weighted cell. For example, the first output level and the second output level can be acquired through means for sampling the analog output. The calibration cell has a weight approximately equal to a weight of a least significant weighted cell and the first output level is ideally equal to the second output level. The DAC circuit includes means for adjusting a weight of a tunable sub-cell of the selected weighted cell to minimize a difference between the first output level and the second output level. For example, the DAC circuit further includes means for computing the difference between the first output level and the second output level, means for filtering the difference to generate a filtered difference, and means for quantizing the filtered difference to establish a tuning word to adjust the weight of the tunable sub-cell.

For purposes of summarizing the invention, certain aspects, advantages, and novel features of the invention have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

A general architecture that implements the various features of the invention will now be described with reference to the drawings. The drawings and the associated descriptions are provided to illustrate embodiments of the invention and not to limit the scope of the invention. Throughout the drawings, reference numbers are re-used to indicate correspondence between referenced elements.

DETAILED DESCRIPTION OF THE PREFERRED EMBODIMENTS

Figure 1:
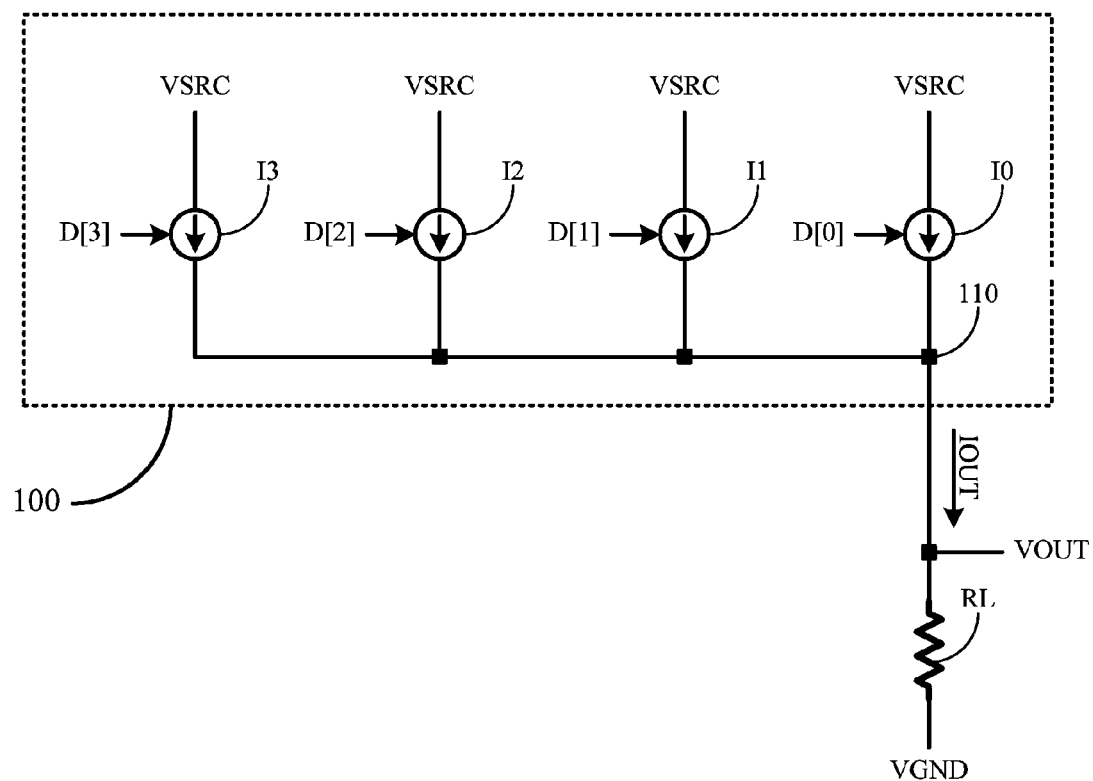
FIG. 1 is a block diagram of a current-steering DAC according to the prior art.

The present invention relates to a method and apparatus for calibrating a DAC. While the specification describes several example embodiments of the invention, it should be understood that the invention can be implemented in many way and is not limited to the particular examples described below or to the particular manner in which any features of such examples are implemented.

The present invention is applicable to any form of a DAC. By way of example but not limitation, a 4-bit current-steering DAC is used to illustrate how this invention can be practiced. As mentioned above, a worse case DNL for a 4-bit DAC occurs when a control code (or digital input word) increments from code 7, which turns on all cells except for a MSB cell in the DAC, to code 8, which turns off all the cells except for the MSB cell. In one embodiment, the present invention calibrates the MSB cell of the DAC so that an incremental change in an analog output of the DAC when the control code changes from code 7 to code 8 is as close as possible to an ideal value (i.e., a value of a LSB cell or $I_{LSB}$).

One method for calibrating a MSB cell of a current-steering 4-bit DAC includes incorporating a calibration cell with a value similar to the LSB cell. The calibration cell is enabled during a calibration process to selectively contribute to an analog output of the 4-bit DAC. The method takes at least two samples of the analog output during the calibration process. For example, a first sample of the analog output is taken when the calibration cell is turned off and all the cells except for the MSB cell is turned off. A second sample of the analog output is taken when the calibration cell is turned on and all the cells except for the MSB cell is turned on. The first sample and the second sample can be taken in any order (e.g., the second sample can be taken before the first sample).

In one embodiment, a calibration sequence controls the on and off states of the calibration cell and the other cells in the 4-bit DAC. The calibration sequence can be an alternating binary sequence with a first logic level and a second logic level. The calibration sequence with the first logic level effectively simulates an input code of 7 to turn on all the cells except for the MSB cell in the 4-bit DAC. The calibration sequence with the second logic level effectively simulates an input code of 8 to turn off all the cells except for the MSB cell in the 4-bit DAC. The calibration cell is turned on when the calibration sequence has the first logic level and turned off when the calibration sequence has the second logic level. Thus, the 4-bit DAC should be generating an analog output with a nominal level of $8 \cdot I_{LSB}$ as the calibration sequence alternates between the first logic level and the second logic level during the calibration process. In other words, the first sample of the analog output and the second sample of the analog output are ideally the same.

In one implementation, the 4-bit DAC outputs an analog current signal that is provided to a load to result in a corresponding analog output voltage. A calibration circuit samples the analog output voltage at the load and saves the samples according to the calibration sequence. The calibration circuit calculates a difference between each pair of consecutive samples to obtain an error term to adjust a level of the MSB cell. For example, a positive error term can be used to indicate that the level of the MSB cell is relatively low and to increase the level of the MSB cell by a small amount (e.g., a fixed amount or a variable amount proportional to the positive error term). Similarly, a negative error term can be used to indicate that the level of the MSB cell is relatively high and to decrease the level of the MSB cell by a small amount (e.g., a fixed amount or a variable amount proportional to the negative error term). In one implementation, the calibration circuit repeatedly takes samples to update the error term to gradually reduce the difference between consecutive samples of the analog output voltage. In this manner, the MSB cell is calibrated to have a level that is approximately equal to combined levels of the other cells plus the calibration cell.

Figure 2:
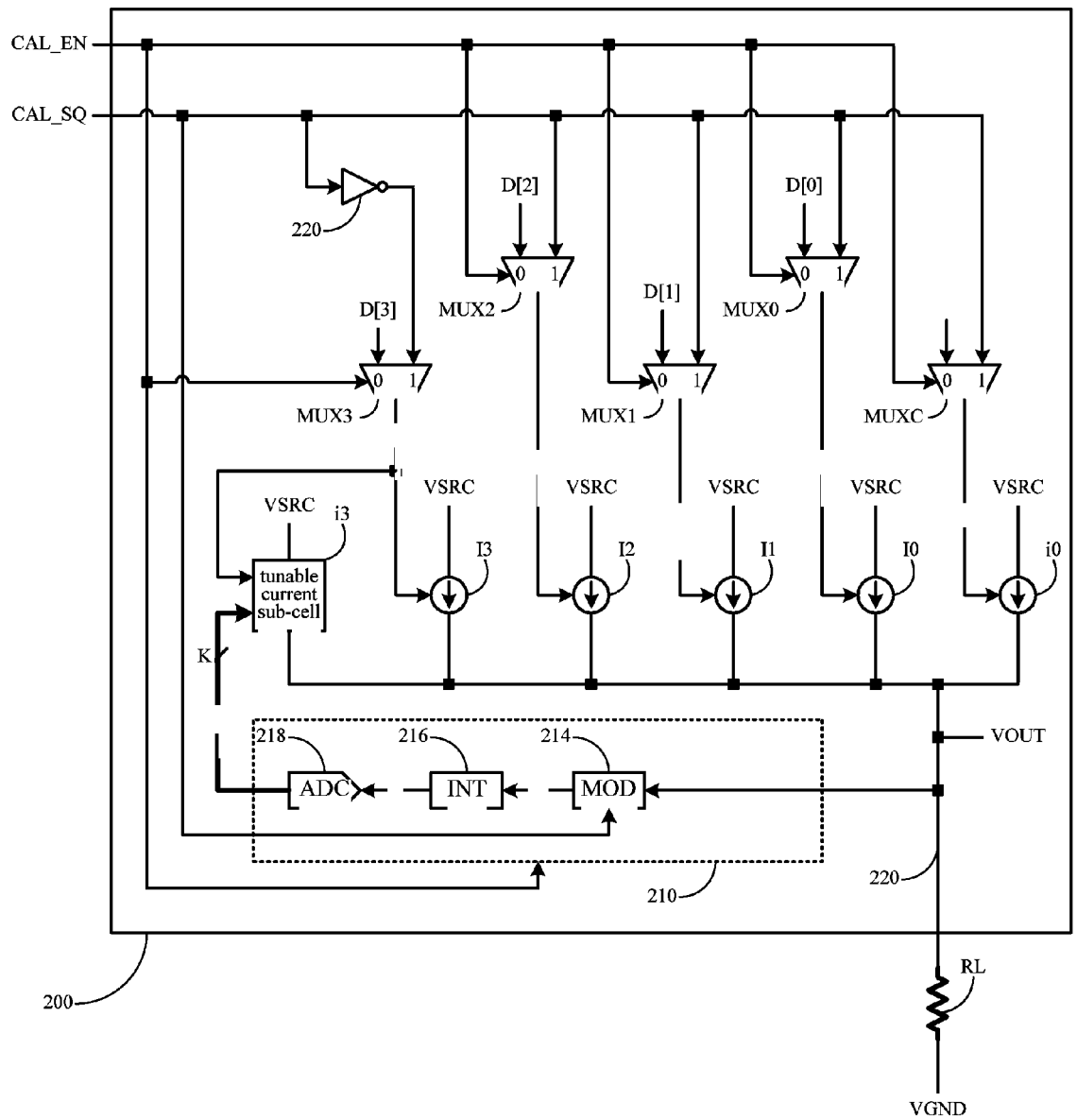
FIG. 2 is a block diagram of a self-calibrating current-steering DAC according to one embodiment of the invention.

FIG. 2 is a block diagram of a self-calibrating current-steering DAC 200 according to one embodiment of the invention. By way of example, the DAC 200 shown in FIG. 2 is a 4-bit DAC with four current cells I0, I1, I2, and I3 having substantially fixed weights. The DAC 200 further includes a calibration cell i0 that has a similar weight as the current cell I0 (i.e., a LSB cell) and a tunable current sub-cell i3 that has a tunable weight controlled by a tunable word (e.g., a K-bit control word E). The tunable current sub-cell i3 is combined with the current cell I3 to generate a tunable cell that responds to a common input bit of the DAC 200 to output a tunable current.

The DAC 200 is configured to receive a four-bit input control code D[3:0] and two logic signals, a calibration-enabling signal CAL_EN and a calibration sequence CAL_SQ. When the calibration-enabling signal has a first logic level (e.g., CAL_EN=0), the DAC 200 operates in a normal mode and the four current cells I0, I1, I2, and I3 output currents under the control of respective bits D[0], D[1], D[2], and D[3] of the input control code. The tunable current sub-cell i3 is also controlled by D[3] of the input control code during the normal mode and turns on whenever the current cell I3 is on. The calibration-enabling signal turns off the calibration cell i0 during the normal mode.

When the calibration-enabling signal has a second logic level (e.g., CAL_EN=1), the DAC 200 operates in a calibration mode to start a self-calibration process. During the calibration process, the calibration cell i0 and the four current cells I0, I1, I2, and I3 output currents under the control of the calibration sequence. The calibration sequence is an alternating binary sequence in one implementation. When the calibration sequence has a first logic level (e.g., CAL_SQ=0), the current cell I3 (i.e., a MSB cell) is turned on while the calibration cell i0 plus the remaining current cells I0, I1, and I2 are off. When the calibration sequence has a second logic level (e.g., CAL_SQ=1), the MSB cell I3 is turned off while the calibration cell i0 and the other current cells I0, I1, and I2 are turned on. The tunable current sub-cell i3 is also controlled by the calibration sequence in the calibration mode to turn on and off synchronously with the MSB cell I3.

In one embodiment, all of the current cells, including the calibration cell i0 and the tunable current sub-cell i3, are connected to a first fixed potential node VSRC on one end and connected to an output node 220 on another end. A loading device represented by a load resistor RL is connected between the output node 220 and a second fixed potential node VGND. The load resistor RL provides a load to a combined output of the current cells and generates an output voltage VOUT at the output node 220.

When the tunable current sub-cell i3 is turned on, its output level is determined by the K-bit control word E. In one embodiment, the DAC 200 further includes a calibration circuit 210 configured to generate and to update the K-bit control word E. The calibration circuit 210 is activated when the calibration-enabling signal is asserted (e.g., CAL_EN=1). When activated, the calibration circuit 210 monitors the output voltage VOUT and adaptively updates the K-bit control word E. During normal operations, the calibration circuit 210 is effectively inactive and the K-bit control word E is frozen or maintained at its last updated value.

In one embodiment, the DAC 200 also includes a plurality of multiplexer circuits MUX0, MUX1, MUX2, and MUX3 with each multiplexer circuit generating an output to control one of the current cells I0, I1, I2, and I3. The multiplexer circuits MUX0, MUX1, MUX2, and MUX3 accept the input control code D[3:0] and the calibration sequence CAL_SQ to respectively generate effective control bits D'[0], D'[1], D'[2], and D'[3] in accordance with the calibration-enabling signal CAL_EN. In one implementation, each bit of the input control code is provided to a first input of a different multiplexer circuit. The calibration sequence CAL_SQ is provided to second inputs of the multiplexer circuits with an inverter logic circuit 220 inserted between the calibration sequence CAL_SQ and the second input of the multiplexer circuit MUX3 associated with the MSB cell I3. The calibration-enabling signal CAL_EN is provided to select lines of the multiplexer circuits to determine whether the outputs of the multiplexer circuits follow the input control code or the calibration sequence. The current cells I0, I1, I2, and I3 are not directly controlled by the input control code D[3:0]. Instead, the effective control bits D'[0], D'[1], D'[2], and D'[3] are provided to the respective current cells I0, I1, I2, and I3 to control their on/off states.

For example, when the calibration-enabling signal is not asserted (e.g., CAL_EN=0), the DAC 200 works in the normal mode and the calibration-enabling signal configures the multiplexer circuits to output signals provided to their respective first inputs. Thus, the effective control code D'[3:0] at the outputs of the multiplexer circuits is equal to the input control code D[3:0] during the normal mode.

When the calibration-enabling signal is asserted (e.g., CAL_EN=1), the DAC 200 works in the calibration mode and the effective control bits are determined by the calibration sequence. For example, the effective control code is equal to 7 (i.e., D'[3:0]=0111) when the calibration sequence has a first logic level (e.g., CAL_SQ=1) and is equal to 8 (i.e., D'[3:0]=1000) when the calibration sequence has a second logic level (e.g., CAL_SQ=0).

During both the normal mode and the calibration mode, the effective control bit D'[3] also controls the tunable current sub-cell i3 in addition to the MSB cell I3. That is, the tunable current sub-cell i3 is turned on whenever the MSB cell I3 is turned on and the tunable current sub-cell i3 is turned off whenever the MSB cell I3 is turned off. Thus, the tunable current sub-cell i3 can be regarded as part of the MSB cell I3 with an adjustable weight controlled by the K-bit control word E as established by the calibration circuit 210.

In one embodiment, the DAC 200 includes an additional multiplexer circuit MUXC to generate an output C to control the calibration cell i0. The additional multiplexer circuit MUXC receives the calibration sequence CAL_SQ and generates the output C in accordance with the calibration-enabling signal CAL_EN. In one implementation, a fixed logic (e.g., logic low) is provided a first input of the additional multiplexer circuit. The calibration sequence is provided to a second input of the additional multiplexer circuit. The calibration-enabling signal is provided to a select line of the additional multiplexer circuit to determine whether the additional multiplexer circuit outputs the fixed logic or the calibration sequence.

For example, when the calibration-enabling signal CAL_EN is not asserted, the additional multiplexer circuit outputs the fixed logic to effectively turn off the calibration cell. When the calibration-enabling signal CAL_EN is asserted, the output of the additional multiplexer circuit follows the calibration sequence. In one implementation, the calibration cell turns on when the calibration sequence has the first logic level and turns off when the calibration sequence has the second logic level while the calibration-enabling signal CAL_EN is asserted. Thus, the calibration cell is only turned on during the calibration mode and when the effective control code to the current cells is equal to 7.

In one embodiment, the calibration sequence CAL_SQ is a binary sequence that periodically alternates between logic 1 and logic 0 while the calibration-enabling signal is asserted (e.g., CAL_EN=1). In response, the effective control code D'[3:0] periodically alternates between code 7 (e.g., when CAL_SQ=1) for a first duration and code 8 (e.g., when CAL_SQ=0) for a second duration. Correspondingly, the calibration cell i0 periodically turns on for the first duration and turns off for the second duration. Thus, the calibration cell and the less significant cells I0, I1, and I2 output currents during the first duration of each period to generate an output voltage of a first level for the DAC 200. The MSB cell I3 and the tunable current sub-cell i3 output currents during the second duration of each period to generate an output voltage of a second level for the DAC 200. In an ideal DAC with all the current cells manufactured to perfect precision, the tunable current sub-cell i3 outputs no current while both the first level and the second level of the output voltage are equal to $8 \cdot I_{LSB} \cdot RL$. Due to finite manufacturing precision, however, the first level of the output voltage will likely be different from the second level of the output voltage when the tunable current sub-cell i3 contributes no current to the output voltage of the DAC.

The calibration circuit 210 in FIG. 2 illustrates one way to adjust the output current of the tunable current sub-cell i3 so that the DAC 200 behaves similar to an ideal DAC. In one embodiment, the calibration circuit 210 includes a modulator circuit 214, a filter circuit 216, and an ADC 218. The modulator circuit 214 samples the output voltage VOUT of the DAC 200 using a two-phase clocking scheme and modulates the samples based on the calibration sequence CAL_SQ. For example, a sample is multiplied (or modulated) by either +1 or −1 depending on the logic level of the calibration sequence CAL_SQ at the time the sample was taken to generate an output Y for the modulator circuit 214. The output Y of the modulator circuit 214 is provided to an input of the filter circuit 216. The filter circuit 216 can be an integrator that performs a cumulative sum of the output of the modulator circuit 214, which is effectively a cumulative sum of the differences between the first level and the second level of the output voltage of the DAC. An output Z of the filter circuit 216 is provided to the ADC 218 to generate the K-bit control word E that controls the output current of the tunable current sub-cell i3. For example, the K-bit control word E increases/decreases to increase/decrease the output current of the tunable current sub-cell i3 depending on the difference between the first level of the output voltage and the second level of the output voltage. In this manner, the output current of the tunable current sub-cell i3 is adjusted in a feedback loop to make the second level of the output voltage approach the first level of the output voltage, thus minimizing the DNL between code 7 and code 8 for the DAC 200.

The principle of the present invention can be practiced in various alternative embodiments. For example, it is not limited to current-steering DACs. The principle works just as well for a switched-capacitor DAC. In addition, it is not limited to a 4-bit DAC. The principle applies to any DAC that includes a more significant cell and a plurality of less significant cells, where a nominal weight of the more significant cell is greater than a sum of nominal weights of the less significant cells plus a unit amount. The more significant cell can be calibrated to reduce a difference between an actual output generated by the more significant cell and a sum of actual outputs generated by the less significant cells plus the unit amount.

In one embodiment, multiple cells of a DAC can be calibrated in a recursive manner. For instance, in a 5-bit DAC with five cells I0, I1, I2, I3, and I4 having nominal weights of $2^0 \cdot I_{LSB}$, $2^1 \cdot I_{LSB}$, $2^2 \cdot I_{LSB}$, $2^3 \cdot I_{LSB}$, and $2^4 \cdot I_{LSB}$, respectively, the cell I3 can be calibrated first to minimize a DNL between code 7 and code 8. After the calibration process has been completed for the cell I3, the cell I4 can be calibrated to minimize a DNL between code 15 (e.g., with all the cells turned on except for the cell I4) and code 16 (e.g., with all the cells turned off except for the cell I4). In this manner, a less significant cell is calibrated before a more significant cell. That is, in a DAC in which multiple cells are designated for calibration, a calibration process selects one cell to calibrate at a time and selects the designated cells in an order ranging from less significant weight to more significant weight.

Figure 3:
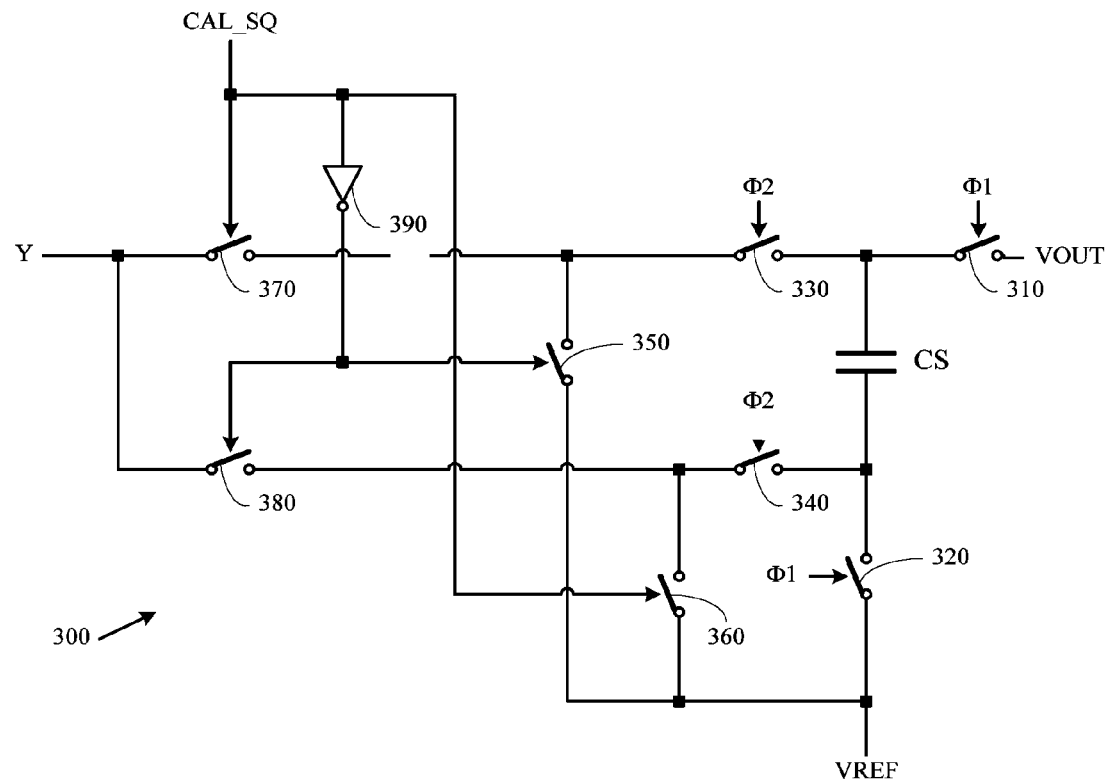
FIG. 3 is a schematic diagram of one embodiment of a modulator circuit shown in FIG. 2.

Various embodiments of current cells, multiplexers, and filter circuits (e.g., discrete-time integrators) can be used in the DAC 200 shown in FIG. 2. Details of these various embodiments are well known in the prior art and are not described in further detail here. FIG. 3 is a schematic diagram of one embodiment of a modulator circuit 300 that can be used in the calibration circuit 210 shown in FIG. 2. The modulator circuit 300 includes a sampling capacitor CS, a first plurality of switches 310, 320, 330, and 340 operating in accordance with a two-phase non-overlapping clock Φ1 and Φ2, and a second plurality of switches 350, 360, 370, and 380 operating in accordance with the calibration sequence and its logic inversion (or complement) generated by using an inverter logic circuit 390. During a sampling phase (e.g., when Φ1=1 and Φ2=0), the output voltage VOUT of the DAC 200 is sampled by the sampling capacitor CS. During a transfer phase (e.g., when Φ1=0 and Φ2=1), the sampled voltage is transferred to an output Y of the modulator circuit 300 without a polarity inversion if CAL_SQ=1 and with a polarity inversion if CAL_SQ=0. A voltage reference VREF denotes a fixed potential node in the modulator circuit 300.

While certain embodiments of the inventions have been described, these embodiments have been presented by way of example only, and are not intended to limit the scope of the inventions. Indeed, the novel methods and devices described herein may be embodied in a variety of other forms; furthermore, various omissions, substitutions, and changes in the form of the methods and devices described herein may be made without departing from the spirit of the inventions. The accompanying claims and their equivalents are intended to cover such forms or modifications as would fall within the scope and spirit of the inventions.

What is claimed is:

1. An apparatus comprising:
   a group of weighted cells, a tunable cell having a tunable weight controlled by a tuning word, and a calibration cell configured to generate a combined output signal in response to a digital input word, a calibration-enabling signal, and a calibration sequence; and
   a calibration circuit configured to sample and subsequently process the combined output signal to establish the tuning word in accordance with the calibration-enabling signal and the calibration sequence, wherein the calibration sequence is an alternating binary sequence.

2. The apparatus of claim 1, wherein the calibration cell is turned on when the calibration-enabling signal is asserted and the calibration sequence has a first logic level.

3. The apparatus of claim 2, wherein each of the weighted cells is turned on either when the calibration-enabling signal is asserted and the calibration sequence has the first logic level or when the calibration-enabling signal is not asserted and a respective bit of the digital input word has the first logic level.

4. The apparatus of claim 3, wherein the tunable cell is turned on either when the calibration-enabling signal is asserted and the calibration sequence has a second logic level or when the calibration-enabling signal is not asserted and a respective bit of the digital input word has the first logic level.

5. The apparatus of claim 1, wherein the calibration circuit comprises a modulator circuit, a filter circuit, and an analog-to-digital converter.

6. The apparatus of claim 5, wherein the modulator circuit comprises:
   a sampling capacitor; and
   a plurality of switches operated in accordance with a two-phase clocking scheme to periodically sample the combined output signal and to transfer resultant samples to an input of the filter circuit with a polarity inversion when the calibration sequence has the first logic level and without the polarity inversion when the calibration sequence has the second logic level.

7. The apparatus of claim 1, wherein the tunable cell comprises a first sub-cell of a fixed weight and a second sub-cell of the tunable weight controlled by the tuning word.

8. The apparatus of claim 1, wherein the calibration circuit is disabled and the tuning word is frozen when the calibration-enabling signal is not asserted.

9. The apparatus of claim 1, wherein a nominal value of a weight for the tunable cell is approximately equal to a sum of nominal values of weights for the calibration cell and the weighted cells.

10. The apparatus of claim 1, further comprising an additional tunable cell having an additional tunable weight controlled by an additional tuning word, wherein a nominal value of a weight for the additional tunable cell is approximately equal to a sum of nominal values of weights for the calibration cell, the weighted cells, and the tunable cell.

11. A method of calibrating a digital-to-analog converter configured to generate an analog output signal and comprising a group of weighted cells with each of the weight cells having an on state and an off state, the method comprising the steps of:
   (a) incorporating a calibration cell as an additional contributor to the analog output signal, wherein the calibration cell has an on state and an off state;
   (b) selecting one of the weighted cells as a subject cell for calibration;
   (c) acquiring a first sample by sampling the analog output signal when the calibration cell and the weighted cells not selected as the subject cell are in the off state while the subject cell is in the on state;
   (d) acquiring a second sample by sampling the analog output signal when the calibration cell and the weighted cells that carry a less weight than the subject cell are in the on state while the subject cell and the weighted cells that carry a more weight than the subject cell are in the off state;
   (e) computing a difference between the first sample and the second sample;
   (f) adapting a tuning word in accordance with the difference;
   (g) adjusting a weight of the subject cell in accordance with the tuning word; and
   (h) repeating steps (c) to (g) for a plurality of times.

12. The method of claim 11, wherein the subject cell comprises a first sub-cell with a fixed weight and a second sub-cell with a tunable weight controlled by the tuning word.

13. The method of claim 12, further comprising repeating steps (b) to (h) with a different one of the weighted cells selected as the subject cell in step (b), wherein the weighted cell currently selected as the subject cell carries a more weight than the weighted cell previously selected as the subject cell.

14. The method of claim 11, wherein step (f) comprises filtering the difference to generate a filtered difference and quantizing the filtered difference to adapt the tuning word.

15. The method of claim 11, wherein a nominal value of the subject cell's weight is approximately equal to a sum of nominal values of the weights for the weighted cells that carry a less weight than the subject cell plus a nominal value of the calibration cell's weight.

16. A digital-to-analog converter that uses a group of weighted cells to generate an analog output, the digital-to-analog converter comprising:

means for starting a self-calibration process in the digital-to-analog converter to tune a selected weighted cell;

means for acquiring a first output level representing a weight of the selected weighted cell;

means for acquiring a second output level representing a summation of weights of a calibration cell and the weighted cells that carry a less weight than the selected weighted cell, wherein the calibration cell has a weight approximately equal to a weight of a least significant weighted cell; and means for adjusting a weight of a tunable sub-cell of the selected weighted cell to minimize a difference between the first output level and the second output level.

17. The digital-to-analog converter of claim 16, further comprising means for sampling the analog output to acquire the first output level and the second output level.

18. The digital-to-analog converter of claim 17, further comprising means for computing the difference between the first output level and the second output level.

19. The digital-to-analog converter of claim 18, further comprising means for filtering the difference to generate a filtered difference and quantizing the filtered difference to establish a tuning word to adjust the weight of the tunable sub-cell.

* * * * *